US 8,268,721 B2

(12) United States Patent
Asako

(10) Patent No.: US 8,268,721 B2
(45) Date of Patent: Sep. 18, 2012

(54) SEMICONDUCTOR DEVICE AND SEMICONDUCTOR DEVICE MANUFACTURING METHOD

(75) Inventor: Ryuichi Asako, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/171,619

(22) Filed: Jun. 29, 2011

(65) Prior Publication Data

US 2012/0001304 A1    Jan. 5, 2012

(30) Foreign Application Priority Data

Jul. 2, 2010    (JP) ................. 2010-152217

(51) Int. Cl.
*H01L 21/4763* (2006.01)
(52) U.S. Cl. ........ 438/643; 438/597; 438/623; 438/642; 257/E21.577; 257/E21.495
(58) Field of Classification Search .......... 438/642
See application file for complete search history.

(56) References Cited

U.S. PATENT DOCUMENTS

| | | | | |
|---|---|---|---|---|
| 5,605,867 A | * | 2/1997 | Sato et al. ............... | 438/790 |
| 6,972,253 B2 | * | 12/2005 | Liu et al. ................ | 438/627 |
| 2002/0182851 A1 | * | 12/2002 | Yeh et al. ............... | 438/633 |
| 2004/0266172 A1 | * | 12/2004 | Kim ....................... | 438/623 |
| 2006/0024849 A1 | | 2/2006 | Zhu et al. | |
| 2006/0201533 A1 | * | 9/2006 | Wani et al. .............. | 134/1.1 |
| 2006/0264037 A1 | * | 11/2006 | Sandhu et al. ........... | 438/643 |
| 2009/0072401 A1 | * | 3/2009 | Arnold et al. ........... | 257/751 |

FOREIGN PATENT DOCUMENTS

| | | |
|---|---|---|
| JP | 2005-340604 | 12/2005 |
| JP | 2006-210774 | 8/2006 |
| JP | 2008-509543 | 3/2008 |

* cited by examiner

*Primary Examiner* — Angel Roman
(74) *Attorney, Agent, or Firm* — Turocy & Watson, LLP

(57) ABSTRACT

There are provided a semiconductor device and a semiconductor device manufacturing method capable of preventing electrical leakage while suppressing increase of wiring resistance and deterioration of productivity. The semiconductor device manufacturing method for forming on a substrate a semiconductor device having a porous low-k film serving as an interlayer insulating film. Further, the semiconductor device manufacturing method includes forming the low-k film on the substrate; etching the low-k film to form a trench or a hole therein; reforming a surface of the low-k film exposed by etching the low-k film by allowing plasma of a nitro compound to act on the exposed surface within the trench or the hole; and filling the trench or the hole with a conductor.

11 Claims, 4 Drawing Sheets

US 8,268,721 B2

SEMICONDUCTOR DEVICE AND SEMICONDUCTOR DEVICE MANUFACTURING METHOD

CROSS-REFERENCE TO RELATED APPLICATION

This application claims the benefit of Japanese Patent Application No. 2010-152217 filed on Jul. 2, 2010, the entire disclosures of which are incorporated herein by reference.

FIELD OF THE INVENTION

The present disclosure relates to a semiconductor device and a semiconductor device manufacturing method.

BACKGROUND OF THE INVENTION

Conventionally, in the field of manufacture of a semiconductor device, a low-k film such as a SiCHO-based film has been used as an insulating layer, e.g., an interlayer insulating film. It has been considered to further reduce a dielectric constant of such a SiCHO-based low-k film by forming pores in the low-k film, i.e., forming a porous low-k film and increasing the porosity thereof.

If a trench or a hole is formed in such a porous low-k film by plasma etching or the like, an inner wall of the trench or the hole exposed to plasma may be damaged and deteriorated. As a solution, there has been known a method of recovering damage by providing a recovery agent containing hydrocarbon to the trench or the hole (see, for example, Patent Document 1).

Further, if the trench or the hole is formed in the porous low-k film as mentioned above, the pores may be exposed on an inner wall of the trench or the hole. Thus, roughness of the inner wall of the trench or the hole may be increased, which in turn causes an increase of resistance of a barrier metal or a copper wiring buried in the trench or the hole. Furthermore, if the pores are not separated but connected as a continuous hole, a wiring metal may be diffused even to the inside of the low-k film through the continuous hole, resulting in electrical leakage. To solve the problem, there has been known a method of forming a sealing layer on an exposed portion of the low-k film by CVD or the like (see, for example, Patent Document 2).

Patent Document 1: Japanese Patent Laid-open Publication No. 2006-210774
Patent Document 2: Japanese Patent Laid-open Publication No. 2008-509543

As stated above, if the porous low-k film is used in the semiconductor device, the pores may be exposed on an inner sidewall of the trench or the hole when the trench or the hole for burying therein the wiring metal is formed in the low-k film. As a result, the metal may diffuse within the pores, raising a likelihood of generation of electrical leakage. Further, roughness of the inner sidewall may be increased, resulting in increase of wiring resistance as well. These problems may become remarkable when the dielectric constant of the low-k film is further reduced by increasing the porosity of the low-k film.

Moreover, when the method of forming the sealing layer by the CVD or the like is used to avoid these problems, a sealing layer may also be formed on an underlying copper wiring exposed on a bottom of the trench or the hole. Thus, a sealing layer removing process for removing this sealing layer on the copper wiring needs to be performed, which may result in deterioration of productivity due to increase of the number of required processes.

BRIEF SUMMARY OF THE INVENTION

In view of the foregoing, the present disclosure provides a semiconductor device and a semiconductor device manufacturing method capable of preventing electrical leakage while suppressing increase of wiring resistance and deterioration of productivity.

In accordance with one aspect of the present disclosure, there is provided a semiconductor device manufacturing method for forming on a substrate a semiconductor device having a porous low-k film serving as an interlayer insulating film. The method includes forming the low-k film on the substrate; etching the low-k film to form a trench or a hole therein; reforming a surface of the low-k film exposed by etching the low-k film by allowing plasma of a nitro compound to act on the exposed surface within the trench or the hole; and filling the trench or the hole with a conductor.

In accordance with another aspect of the present disclosure, there is provided a semiconductor device including a porous low-k film used as an interlayer insulating film; and a reformed layer formed on an inner wall of a trench or a hole. The trench or the hole may be formed in the low-k film by etching to fill a wiring conductor therein and the reformed layer may be formed by allowing plasma of a nitro compound to act on the inner wall.

In accordance with the present disclosure, it is possible to provide a semiconductor device and a semiconductor device manufacturing method capable of preventing electrical leakage while suppressing increase of wiring resistance and deterioration of productivity.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1A:
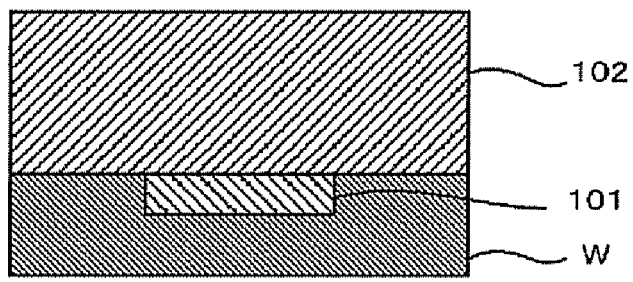
FIGS. 1A to 1D are schematic diagrams for describing a semiconductor device manufacturing method in accordance with an embodiment of the present disclosure.

Hereinafter, embodiments of the present disclosure will be described in detail with reference to the accompanying drawings. FIGS. 1A to 1D depict cross sectional views schematically showing a structure of major parts of a semiconductor wafer W in order to describe a semiconductor device manufacturing method in accordance with an embodiment of the present disclosure. In the present embodiment, as depicted in FIGS. 1A to 1D, a porous low-k film 102 is formed on a semiconductor wafer W having an underlying copper wiring 101 or the like (FIG. 1A).

By way of example, Black Diamond (Registered Trademark: Applied Materials Corp.) or Aurora (Registered Trademark: ASM International N.V.) may be used as the porous low-k film 102.

Figure 1B:
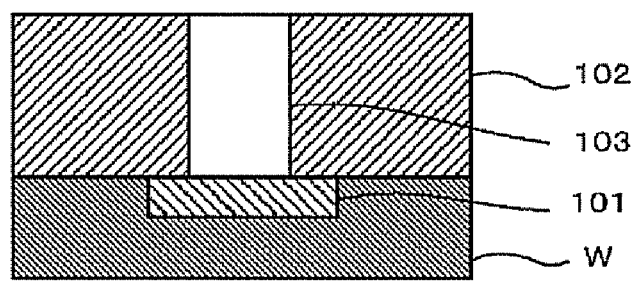

Subsequently, a trench (or hole) 103 is formed at a certain portion of the porous low-k film 102 such that a part of the underlying copper wiring 101 is exposed (FIG. 1B). This process may be implemented by, e.g., plasma etching using a patterned photoresist as a mask. After this process is completed, pores at an inner wall of the trench (hole) 103 may be exposed, and roughness of the inner wall may become higher.

Figure 1C:
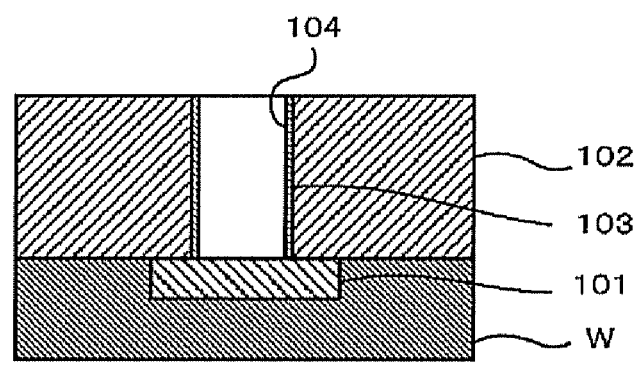

Then, there is performed a reform (quality modification or modification) process for forming a reformed (modified) layer 104 by reforming an exposed surface at the inner wall of the trench (hole) 103 (i.e., a sealing process for filling up the pores is performed) (FIG. 1C). In this process, plasma of a nitro compound including a nitro group having a strong electron attracting characteristic is made to act on the exposed surface of the inner wall of the trench (hole) 103. By way of example, the nitro compound used for this process may be nitromethane. However, nitroethane or nitropropane may also be used as the nitro compound. The reform (quality modification or modification) process will be described in detail later.

Figure 1D:
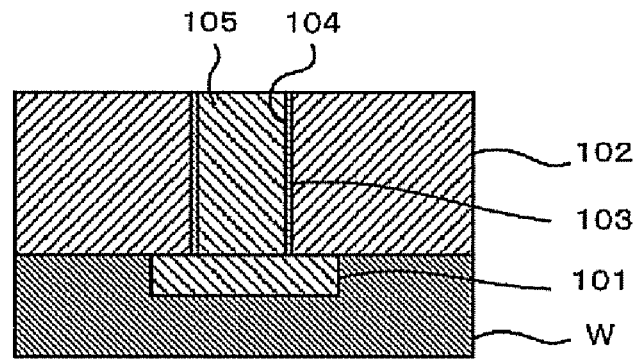

After the exposed surface of the inner wall of the trench (or hole) 103 is reformed (modified), copper serving as a wiring metal is directly filled in the trench (or hole) 103 or filled therein after a barrier layer is formed, so that a wiring layer 105 electrically connected with the underlying copper wiring 101 is formed (FIG. 1D).

As stated above, in accordance with the present embodiment, the reformed (modified) layer 104 is formed on the exposed surface of the inner wall of the low-k film 102 by allowing the plasma of the nitro compound to act on the exposed surface. In this way, after the pores in the inner wall of the low-k film is sealed, that is, after the roughness of the inner wall of the low-k film is reduced, copper or the like for forming the wiring layer 105 is filled. Accordingly, resistance of the wiring layer 105 can be reduced, and electrical leakage caused by a diffusion of the wiring metal into the pores of the low-k film 102 can be prevented.

Figure 2:
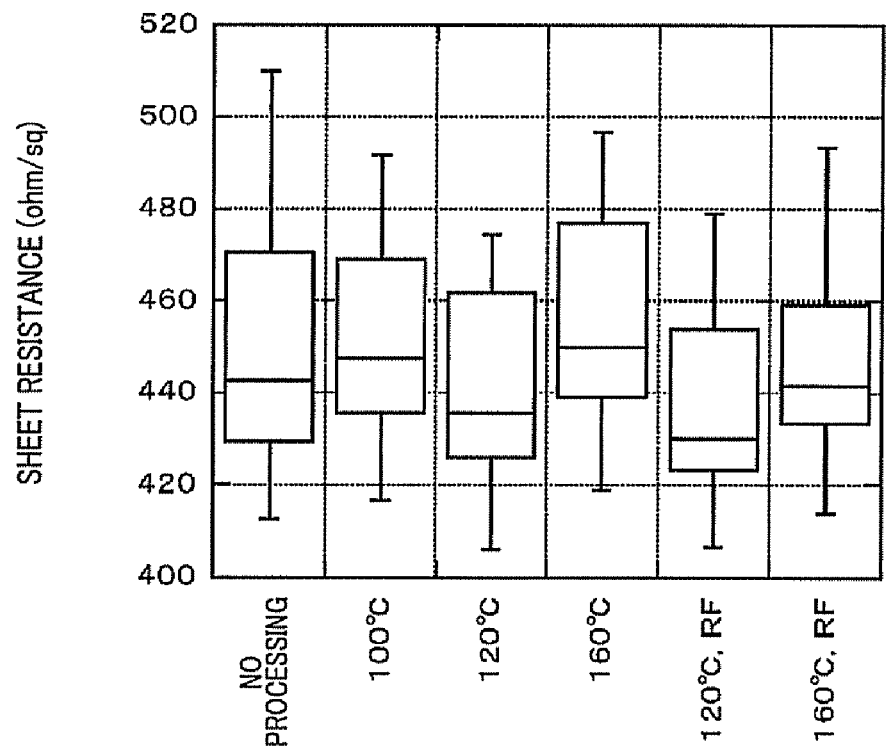
FIG. 2 is a graph showing a result of investigating a difference in sheet resistance values after performing a reform process.

FIG. 2 is a graph of which vertical axis represents a sheet resistance (ohms/sq). A leftmost graph indicates a sheet resistance value in a case without performing a reform (quality modification or modification) process or the like; a rightmost graph indicates a sheet resistance value in a case of performing a reform process at a temperature of about 160° C. by plasma of nitromethane; and a second graph from the right indicates a sheet resistance value in a case of performing a reform process at a temperature of about 120° C. by plasma of nitromethane. Further, measurements of the sheet resistance value and a leakage current to be described later were performed for the case of forming a barrier metal on a porous low-k film of a blanket which is etched by a CF-based gas and ashed by a CO gas. Further, a second, a third and a fourth graph from the left indicate sheet resistance values in cases of performing heat treatment at temperatures of about 100° C., about 120° C. and about 160° C., respectively, in the nitromethane atmosphere without using plasma.

As depicted in FIG. 2, when the reform process is performed by the plasma of nitromethane, the sheet resistance value is found to decrease as compared to a case without performing the reform process. At this time, the effect of reducing the sheet resistance value is higher at the processing temperature of about 120° C. than at the processing temperature of about 160° C. Further, when the heat treatment is merely performed in a nitromethane atmosphere without using plasma, the sheet resistance value is found to slightly decrease at the temperature of about 120° C., but such a sheet resistance value reducing effect is hardly found at the other temperatures. In view of this, it may be desirable to perform the reform process by using the plasma of nitromethane in order to reduce the sheet resistance value.

Figure 3:
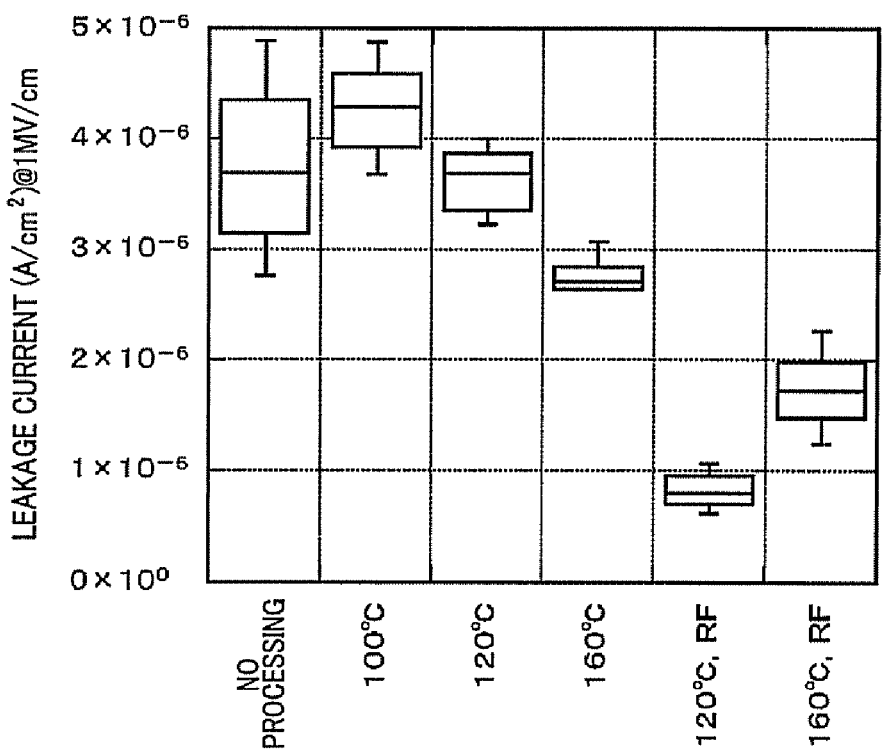
FIG. 3 is a graph showing a result of investigating a difference in leakage current values after performing a reform process.

FIG. 3 is a graph of which vertical axis represents a leakage current (A/cm$^2$) when a voltage of about 1 MV/cm is applied. A leftmost graph indicates a leakage current value in a case without performing a reform (quality modification or modification) process or the like; a rightmost graph indicates a leakage current value in a case of performing a reform process at a temperature of about 160° C. by plasma of nitromethane; and a second graph from the right indicates a leakage current value in a case of performing a reform process at a temperature of about 120° C. by plasma of nitromethane.

As shown in FIG. 3, when the reform process is performed by the plasma of nitromethane, the leakage current value is found to decrease as compared to a case without performing the reform process. At this time, the effect of reducing the leakage current value is higher at the processing temperature of about 120° C. than at the processing temperature of about 160° C. Further, when the heat treatment is merely performed in a nitromethane atmosphere without using plasma (second to fourth graphs from the left), the leakage current value is found to slightly decrease at temperatures of about 120° C. and about 160° C., but such a leakage current value reducing effect is lower than that in case of using the plasma. Moreover, such a leakage current value reducing effect is hardly found at a temperature of about 100° C. In view of this, it may be desirable to perform the reform process by using the plasma of nitromethane in order to reduce the leakage current value.

The above-discussed sheet resistance value reducing effect and the leakage current value reducing effect by the reform process may also be achieved by using plasma of a material other than the nitro compound, such as acetonitrile or 1,1,1-trifluoro-2-ethyliodide. If these materials are used, however, deposits may be deposited on the underlying copper wiring, and the deposits need to be removed.

Figure 4:
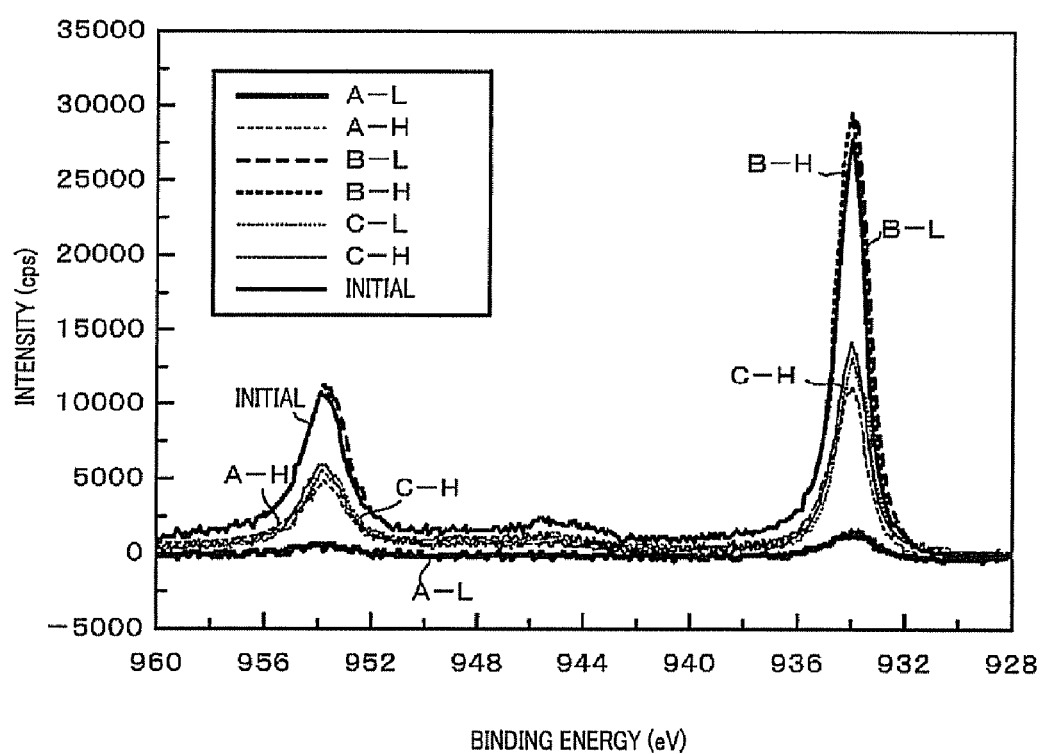
FIG. 4 is a graph showing a result of investigating a difference in XPS analyses after performing a reform process.

FIG. 4 is a graph showing XPS (X-ray Photoelectron Spectroscopy) results in each case of performing a reform process by using plasma of the nitromethane, the acetonitrile and the 1,1,1-trifluoro-2-ethyliodide in comparison with a case before performing the reform process. In FIG. 4, a vertical axis represents intensity and a horizontal axis represents binding energy. In FIG. 4, curves marked by B-L and B-H indicate cases of using the nitromethane. As indicated by these curves B-L and B-H, when the nitromethane is used, an XPS result is hardly different from an XPS result before the reform process is performed (indicated by an initial curve in FIG. 4). Meanwhile, when the acetonitrile is used (indicted by curves A-L and A-H in FIG. 4) and the 1,1,1-trifluoro-2-ethyliodide is used (indicated by curves C-L and C-H in FIG. 4), detected peak values of copper are found to be smaller than a peak value before the reform process, which implies that a deposit is formed on the copper. Accordingly, a process for removing the deposit needs to be performed before the wiring metal is filled. "L" in such a notation as B-L represents a case where a plasma source power is low as about 30 W and "H" in such a notation as B-H represents a case where a plasma source power is high as about 150 W.

As discussed above, when the reform process is performed by using the nitro compound such as nitromethane, only methane and a nitrogen oxide gas may be generated as byproducts, and no deposit may be deposited on the copper wiring. Thus, the wiring metal can be filled or the barrier layer can be formed without having to perform an additional process of removing the deposit. Accordingly, deterioration of productivity can be prevented.

Figure 5:
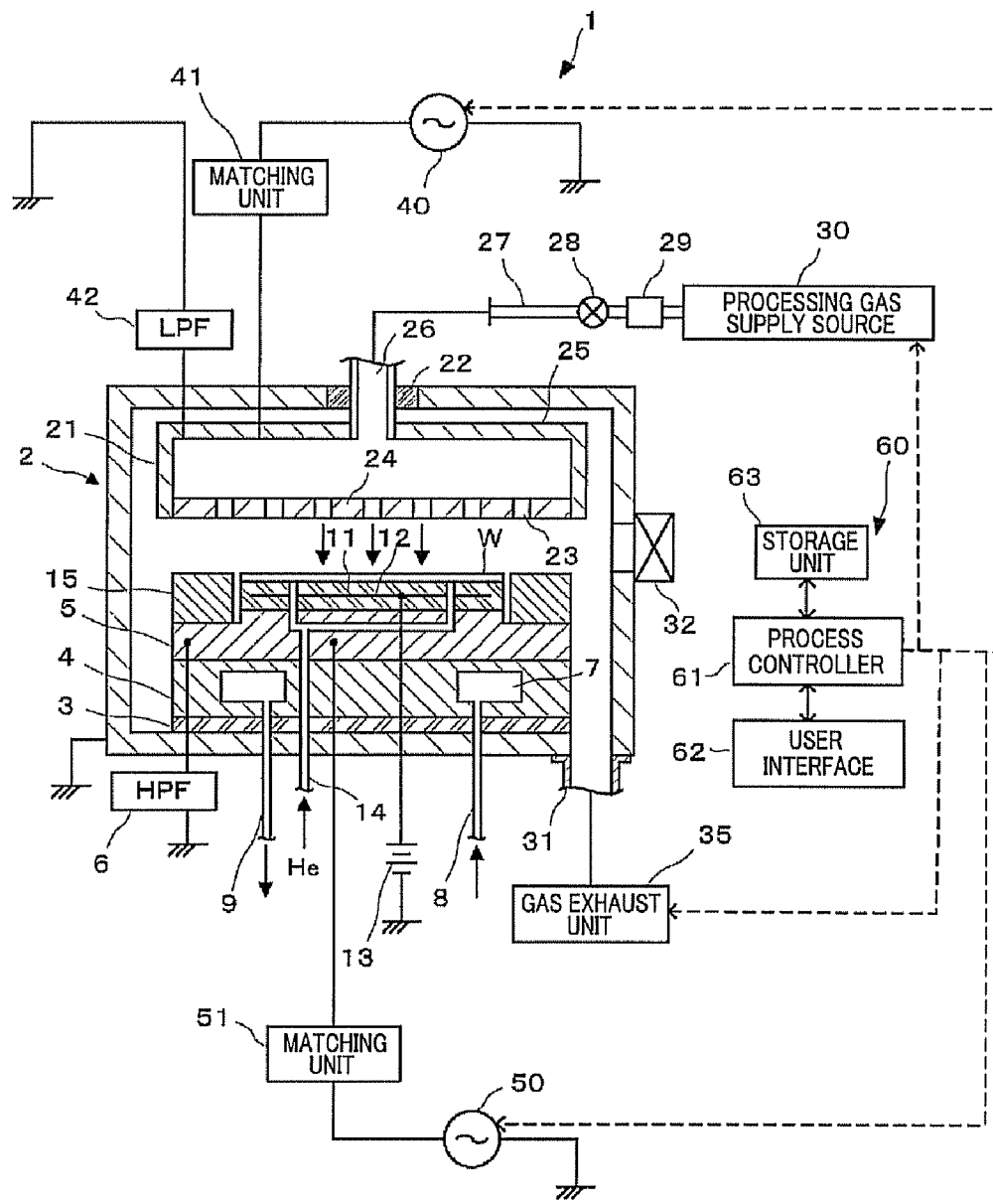
FIG. 5 is a diagram showing a schematic configuration of a plasma processing apparatus used in a reform process.

Now, a configuration example of a plasma processing apparatus for performing the above-described reform process by the plasma of the nitro compound will be explained. FIG. 5 is a diagram schematically showing a cross sectional configuration of a plasma processing apparatus (plasma etching apparatus) that can be used for the reform process.

A plasma processing apparatus 1 may include a cylindrical processing chamber (processing vessel) 2 made of, e.g., aluminum of which surface is anodically oxidized, and the processing chamber 2 is grounded. Further, a substantially columnar susceptor support 4 for mounting thereon a processing target substrate such as a semiconductor wafer W is provided on a bottom of the processing chamber 2 via an insulating plate 3 made of, e.g., ceramics between the processing chamber 2 and the susceptor support 4. On the susceptor support 4, a susceptor (mounting table) 5 serving as a lower electrode is provided, and the susceptor 5 is connected with a high pass filter (HPF) 6.

Inside the susceptor support 4, a temperature control medium cavity 7 is provided. A temperature control medium is introduced into the temperature control medium cavity 7 through an inlet line 8 and circulated therein, and then discharged through a discharge line 9. Heat of the temperature control medium is transferred to the semiconductor wafer W via the susceptor 5, and, thus, a temperature of the semiconductor wafer W can be controlled to a desired temperature.

The susceptor 5 is formed in a circular plate shape having thereon a protruding central portion, and a circular electrostatic chuck 11 having substantially the same shape as the semiconductor wafer W is provided on the susceptor 5. The electrostatic chuck 11 may include an electrode 12 embedded in an insulating member. Further, a DC voltage of, e.g., about 1.5 kV is applied to the electrostatic chuck 11 from a DC power supply 13 connected to the electrode 12, so that the semiconductor wafer W is electrostatically attracted to the electrostatic chuck 11 by, e.g., a Coulomb force.

Formed through the insulating plate 3, the susceptor support 4, the susceptor 5 and the electrostatic chuck 11 is a gas passage 14 through which a heat transfer medium (for example, a He gas) is supplied to a rear surface of the semiconductor wafer W. Heat of the susceptor 5 is transferred to the semiconductor wafer W by the heat transfer medium, and, thus, the temperature of the semiconductor wafer W can be maintained to a certain temperature.

An annular focus ring 15 is provided at a periphery of a top surface of the susceptor 5 so as to surround a periphery of the semiconductor wafer W mounted on the electrostatic chuck 11. The focus ring 15 may be made of, e.g., silicon.

An upper electrode 21 is provided above the susceptor 5, facing the susceptor 5 in parallel (opposite to the susceptor 5). The upper electrode 21 is supported at an upper portion of the processing chamber 2 via an insulating member 22. The upper electrode 21 may include an electrode plate 24 and an electrode support 25 made of a conductive material, for supporting the electrode plate 24. The electrode plate 24 is made of, e.g., a conductor or a semiconductor and is provided with a multiple number of discharge holes 23. The electrode plate 24 serves as a facing surface to the susceptor 5.

A gas inlet port 26 is formed at the center of the electrode support 25 of the upper electrode 21, and the gas inlet port 26 is connected with a gas supply pipe 27. Further, a processing gas supply source 30 is connected to the gas supply pipe 27 via a valve 28 and a mass flow controller 29. The processing gas supply source 30 supplies a processing gas for plasma etching.

A gas exhaust pipe 31 is connected to the bottom of the processing chamber 2, and the gas exhaust pipe 31 is connected with a gas exhaust unit 35. The gas exhaust unit 35 may include a vacuum pump such as a turbo-molecular pump and is configured to evacuate the processing chamber 2 to maintain the inside of the processing chamber 2 at a preset depressurized atmosphere, i.e., to a preset pressure of, e.g., about 1 Pa or less. Further, a gate valve 32 is provided at a sidewall of the processing chamber 2, and with the gate valve 32 open, the semiconductor wafer W is transferred to/from an adjacent load-rock chamber (not illustrated).

The upper electrode 21 is connected with a first high frequency power supply 40, and a matching unit 41 is provided on a power supply line thereof. Further, the upper electrode 21 is connected with a low pass filter (LPF) 42. The first high frequency power supply 40 outputs a high frequency power of a frequency ranging from about 13.56 MHz to about 100 MHz. In this way, by applying a high frequency power in such a frequency range, it is possible to generate high-density plasma in a desirable dissociated state within the processing chamber 2.

The susceptor 5 serving as a lower electrode is connected with a second high frequency power supply 50, and a matching unit 51 is provided on a power supply line thereof. Further, the second high frequency power supply 50 outputs a high frequency power of a frequency in a range lower than the frequency of the first high frequency power supply 40. By applying a high frequency power in such a frequency range, it is possible to provide an appropriate ion action without damaging the semiconductor wafer W serving as the processing target substrate. By way of example, the second high frequency power supply 50 may output a high frequency power of a frequency ranging from about 1 MHz to about 10 MHz.

As depicted in FIG. 5, an overall operation of the plasma processing apparatus 1 having the above-described configuration may be controlled by a controller 60. The controller 60 may include a process controller 61 having a CPU, for controlling each component of the plasma processing apparatus 1; a user interface 62; and a storage unit 63.

The user interface 62 may include a keyboard with which a process manager inputs commands to manage the plasma processing apparatus 1 or a display on which an operation status of the plasma processing apparatus 1 is visually displayed.

The storage unit 63 may store a control program (software) for executing various processes performed in the plasma processing apparatus 1 under the control of the process controller 61 or recipes that store processing condition data or the like. A desired process can be performed in the plasma processing apparatus 1 under the control of the process controller 61 by retrieving a recipe from the storage unit 63, if necessary, in response to an instruction from the user interface 62 and executing the recipe by the process controller 61. Alternatively, the control program or the recipe such as the processing condition data can be read out from a computer-readable storage medium (for example, a hard disk, a CD, a flexible disk, a semiconductor memory or the like). Alternatively, the control program or the recipe may be read out on-line by receiving it from another apparatus through, for example, a dedicated line whenever necessary.

When a plasma process is performed on the semiconductor wafer W by the plasma processing apparatus 1 having the above-described configuration, the gate valve 32 is opened, and, then, the semiconductor wafer W is loaded into the processing chamber 2 from a non-illustrated load-rock chamber and mounted on the electrostatic chuck 11. A DC voltage is applied from the DC power supply 13 to the electrostatic chuck 11, so that the semiconductor wafer W is electrostatically attracted to and held on the electrostatic chuck 11. Subsequently, the gate valve 32 is closed, and, then, the inside of the processing chamber 2 is evacuated to a preset vacuum level by the gas exhaust unit 35.

Thereafter, the valve 28 is opened, and a processing gas (e.g., nitromethane and Ar) is introduced into a hollow region of the upper electrode 21 from the processing gas supply source 30 through the gas supply pipe 27 and the gas inlet port 26 while its flow rate is controlled by the mass flow controller 29. Then, the processing gas is uniformly discharged toward the semiconductor wafer W through the discharge holes 23 of the electrode plate 24 as indicated by arrows of FIG. 5.

An internal pressure of the processing chamber 2 is maintained at a certain pressure. Then, a high frequency power of a preset frequency (e.g., about 13.56 MHz) and a preset power (e.g., about 30 W) is applied to the upper electrode 21 from the first high frequency power supply 40. Accordingly, a high frequency electric field is generated between the upper electrode 21 and the susceptor 5 serving as the lower electrode, so that the etching gas (processing gas) is dissociated and excited into plasma.

In the plasma process (reform process) in accordance with the present embodiment, a high frequency power from the second high frequency power supply 50 may not be applied. However, if necessary, a high frequency power of a frequency lower than the frequency of the first high frequency power supply 40 may be applied from the second high frequency power supply 50 to the susceptor 5 serving as the lower electrode, so that ions in the plasma may be attracted toward the susceptor 5 and etching anisotropy may be improved by ion-assist.

If the plasma process is completed, the supply of the high frequency power and the supply of the processing gas are stopped, and the semiconductor wafer W is unloaded from the processing chamber 2 in the reverse order to that described above.

The present disclosure may not be limited to the above-described embodiment but can be modified in various ways.

What is claimed is:

1. A semiconductor device manufacturing method for forming on a substrate a semiconductor device having a porous low-k film serving as an interlayer insulating film, the method comprising:
    forming the porous low-k film on the substrate;
    etching the porous low-k film to form a trench or a hole therein;
    reforming a surface of the porous low-k film exposed by etching the porous low-k film by allowing plasma of a nitro compound to act on the exposed surface within the trench or the hole, thereby sealing pores of the porous low-k film on the exposed surface; and
    filling the trench or the hole with a conductor, while preventing a diffusion of the conductor into the pores of the porous low-k film.

2. The semiconductor device manufacturing method of claim 1, wherein the nitro compound is a nitromethane.

3. The semiconductor device manufacturing method of claim 1, wherein a wiring layer made of copper is formed under the porous low-k film.

4. The semiconductor device manufacturing method of claim 2, wherein a wiring layer made of copper is formed under the porous low-k film.

5. The semiconductor device manufacturing method of claim 1, wherein, when reforming a surface of the porous low-k film, the substrate is heated.

6. The semiconductor device manufacturing method of claim 2, wherein, when reforming a surface of the porous low-k film, the substrate is heated.

7. The semiconductor device manufacturing method of claim 3, wherein, when reforming a surface of the porous low-k film, the substrate is heated.

8. The semiconductor device manufacturing method of claim 1, wherein reforming a surface of the porous low-k film is performed by a plasma processing apparatus comprising:
    a processing chamber configured to accommodate the substrate therein;
    a lower electrode provided within the processing chamber and serving as a mounting table for mounting thereon the substrate;
    an upper electrode provided opposite to the lower electrode within the processing chamber; and
    a high frequency power supply configured to supply a high frequency power for generating plasma to the upper electrode.

9. The semiconductor device manufacturing method of claim 2, wherein reforming a surface of the porous low-k film is performed by a plasma processing apparatus comprising:
    a processing chamber configured to accommodate the substrate therein;
    a lower electrode provided within the processing chamber and serving as a mounting table for mounting thereon the substrate;
    an upper electrode provided opposite to the lower electrode within the processing chamber; and
    a high frequency power supply configured to supply a high frequency power for generating plasma to the upper electrode.

10. The semiconductor device manufacturing method of claim 3, wherein reforming a surface of the porous low-k film is performed by a plasma processing apparatus comprising:
    a processing chamber configured to accommodate the substrate therein;
    a lower electrode provided within the processing chamber and serving as a mounting table for mounting thereon the substrate;
    an upper electrode provided opposite to the lower electrode within the processing chamber; and
    a high frequency power supply configured to supply a high frequency power for generating plasma to the upper electrode.

11. The semiconductor device manufacturing method of claim 5, wherein reforming a surface of the porous low-k film is performed by a plasma processing apparatus comprising:
    a processing chamber configured to accommodate the substrate therein;
    a lower electrode provided within the processing chamber and serving as a mounting table for mounting thereon the substrate;
    an upper electrode provided opposite to the lower electrode within the processing chamber; and
    a high frequency power supply configured to supply a high frequency power for generating plasma to the upper electrode.

* * * * *